United States Patent
Kanamitsu

(10) Patent No.: US 11,294,276 B2
(45) Date of Patent: Apr. 5, 2022

(54) TEMPLATE MANUFACTURING METHOD AND TEMPLATE BASE MEMBER

(71) Applicant: Kioxia Corporation, Tokyo (JP)

(72) Inventor: Shingo Kanamitsu, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 771 days.

(21) Appl. No.: 15/695,847

(22) Filed: Sep. 5, 2017

(65) Prior Publication Data
US 2018/0267401 A1 Sep. 20, 2018

(30) Foreign Application Priority Data

Mar. 17, 2017 (JP) ............................. JP2017-053318

(51) Int. Cl.
| | |
|---|---|
| G03F 7/00 | (2006.01) |
| G03F 7/004 | (2006.01) |
| B29C 59/16 | (2006.01) |
| B29C 33/42 | (2006.01) |
| B29C 43/14 | (2006.01) |
| B29C 33/30 | (2006.01) |

(52) U.S. Cl.
CPC .......... *G03F 7/0002* (2013.01); *B29C 33/301* (2013.01); *B29C 33/424* (2013.01); *B29C 43/146* (2013.01); *B29C 59/16* (2013.01); *G03F 7/0035* (2013.01); *G03F 7/0043* (2013.01)

(58) Field of Classification Search
CPC ..... G03F 7/0002; G03F 7/0035; G03F 7/0043
See application file for complete search history.

(56) References Cited

U.S. PATENT DOCUMENTS

| | | | |
|---|---|---|---|
| 6,475,704 B1* | 11/2002 | Iwasaki | C23F 1/02 430/316 |
| 7,396,474 B2 | 7/2008 | Irwin | |
| 7,455,789 B2 | 11/2008 | Hasegawa et al. | |
| 2003/0215753 A1* | 11/2003 | Tseng | G03F 7/20 430/312 |

(Continued)

FOREIGN PATENT DOCUMENTS

| | | |
|---|---|---|
| JP | 2007-042715 A | 2/2007 |
| JP | 2007-140460 A | 6/2007 |

(Continued)

OTHER PUBLICATIONS

J. Micromech. Microeng. 20 (2010) 115012 (Year: 2010).*

*Primary Examiner* — Michael M. Robinson
(74) *Attorney, Agent, or Firm* — Foley & Lardner LLP

(57) ABSTRACT

A template manufacturing method includes preparing a structure including a first substrate and a stacked body that is provided on the first substrate, the stacked body including a first lower layer including a first material, a first upper layer provided on the first lower layer including a second material different from the first material, and a first cover layer provided on a first cover region of the first upper layer and including a third material different from the second material. The method further includes forming a first resist layer on a portion of the first cover layer and on a first portion of the first upper layer, and exposing a second portion of the upper layer. The method yet further includes removing the second portion of the first upper layer using the first cover layer and the first resist layer as a mask.

5 Claims, 13 Drawing Sheets

(56) References Cited

U.S. PATENT DOCUMENTS

| | | |
|---|---|---|
| 2006/0279004 A1 | 12/2006 | Suehira et al. |
| 2011/0290759 A1* | 12/2011 | Furusho ............. H01L 21/3086 |
| | | 216/44 |
| 2011/0294072 A1* | 12/2011 | Park ................... H01L 21/0273 |
| | | 430/312 |

FOREIGN PATENT DOCUMENTS

| | | |
|---|---|---|
| JP | 2010-171109 A | 8/2010 |
| JP | 2012-023242 A | 2/2012 |
| JP | 5119579 B2 | 1/2013 |
| JP | 2013-077665 A | 4/2013 |

* cited by examiner

TEMPLATE MANUFACTURING METHOD AND TEMPLATE BASE MEMBER

CROSS-REFERENCE TO RELATED APPLICATION

This application claims the benefit of and priority to Japanese Patent Application No. 2017-053318, filed Mar. 17, 2017, the entire contents of which are incorporated herein by reference.

FIELD

Embodiments described herein relate generally to a template manufacturing method and a template base member.

BACKGROUND

There are pattern forming methods of transferring step-shaped patterns to substrates by imprinting using templates that define the step-shaped patterns. For example, films provided in semiconductor devices are processed using the transferred patterns. It is preferable in some implementations for the templates to have highly precise shapes.

DETAILED DESCRIPTION

Figure 1A:
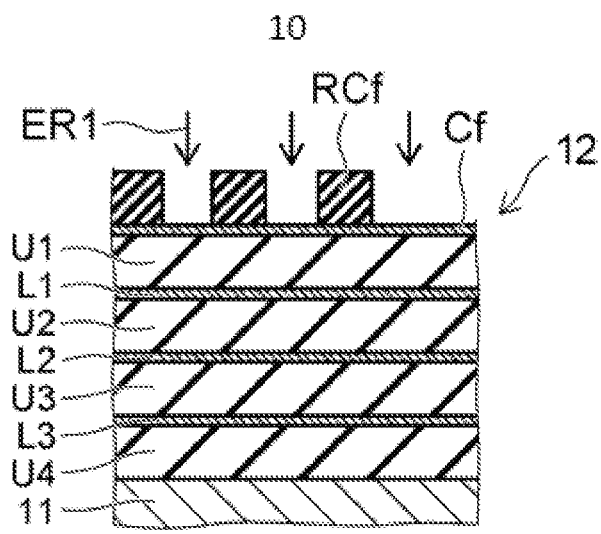
FIG. 1A, FIG. 1B, FIG. 1C, FIG. 1D, FIG. 1E, and FIG. 1F are schematic sectional views showing embodiments of a method of manufacturing a template according to a first aspect.

Example embodiments described herein provide for a template manufacturing method and a template base member capable of improved precision.

In some embodiments according to one aspect, a template manufacturing method includes preparing a structure including a first substrate and a stacked body provided on the first substrate. The stacked body includes a first lower layer including a first material, a first upper layer provided on the first lower layer and including a second material different from the first material, and a first cover layer provided on a first cover region of the first upper layer and including a third material different from the second material. The template manufacturing method includes forming a first resist layer on a portion of the first cover layer and at least a portion of a region excluding the first cover region of the first upper layer. The template manufacturing method includes removing a portion of the first upper layer using the first cover layer and the first resist layer as a mask to expose a portion of the first lower layer.

In some embodiments, according to another aspect, a template manufacturing method includes preparing or providing a first template that includes a plurality of stacked films, each of the plurality of stacked films including a lower layer including a first material and an upper layer including a second material different from the first material, and a first surface of the first template including a step structure in which one or more a steps are defined by each of the plurality of stacked films. Forming a resin layer to form a second template includes disposing a resin liquid film between the first template and a second substrate, and solidifying the resin liquid film while the first surface of the first template is in contact with the resin liquid film to form the resin layer defining a resin layer surface shape that corresponds to a shape of the step structure.

In some embodiments, according to another aspect, a template base member includes a plurality of first layers comprising a first material, and a plurality of second layers comprising a second material different from the first material. The first layer and the second layer are alternately stacked.

Hereinafter, embodiments of the present disclosure will be described with reference to the drawings. The drawings are schematic and conceptual. Relations between thicknesses and widths of portions, ratios of sizes between the portions, and the like may not necessarily be the same as the actual relations, ratios, and the like. When the same portions are illustrated, dimensions and ratios of the portions may differ between drawings in some cases.

In the present specification and the drawings, the same reference numerals are given to the same or similar elements, and repetitive detailed description thereof will be appropriately omitted.

First Aspect

FIG. 1A through FIG. 1F, FIG. 2A through FIG. 2F, and FIG. 3A through FIG. 3C are schematic sectional views showing embodiments of a method of manufacturing a template according to a first aspect.

As illustrated in FIG. 1A, a structure 10 is prepared or provided. The structure 10 includes a first substrate 11 and a stacked body 12. The stacked body 12 is provided on the first substrate 11.

The stacked body 12 includes a plurality of lower layers (such as a first lower layer L1, a second lower layer L2, and a third lower layer L3) and a plurality of upper layers (such as a first upper layer U1, a second upper layer U2, a third upper layer U3, and a fourth upper layer U4). The plurality of lower layers and the plurality of upper layers are alternately arranged. Any number of lower layers and any number of upper layers can be used.

For example, the first lower layer L1 is located between the first upper layer U1 and the first substrate 11. The second upper layer U2 is located between the first lower layer L1 and the first substrate 11. The second lower layer L2 is located between the second upper layer U2 and the first substrate 11. The third upper layer U3 is located between the second lower layer L2 and the first substrate 11. The third lower layer L3 is located between the third upper layer U3 and the first substrate 11. The fourth upper layer U4 is located between the third lower layer L3 and the first substrate 11.

The plurality of lower layers including the first lower layer L1, the second lower layer L2, and the third lower layer L3 contain a first material. For example, the first lower layer L1, the second lower layer L2, and the third layer L3 are layers include the first material. The first material includes, for example, a metal (for example, chromium (Cr)). The first material may contain, for example, a chromium oxide. The plurality of lower layers are, for example, chromium-containing films. The first material may include, for example, carbon. The plurality of lower layers may be carbon films. Hereinafter, description will be provided assuming that the first material includes chromium, but as described above, for example, other embodiments that do not include chromium may be implemented.

The plurality of upper layers contain a second material. For example, the first upper layer U1, the second upper layer U2, the third upper layer U3, and the fourth upper layer U4 are layers including the second material. The second material includes, for example, a silicon oxide. The second material includes, for example, quartz.

The respective thicknesses of the plurality of lower layers (chromium-containing layers) are substantially the same as each other. The thickness of each of the plurality of lower layers is, for example, equal to or greater than about 5 nanometers (nm) and equal to or less than about 50 nm.

The respective thicknesses of the plurality of upper layers (for example, silicon oxide layers) are substantially the same as each other. For example, the thickness of each of the plurality of upper layers is thicker than the thickness of any of the plurality of lower layers. For example, the thickness of each of the plurality of upper layers is about 5 or more times and about 50 or less times the thickness of any of the plurality of lower layers. The thickness of each of the plurality of upper layers is, for example, equal to or greater than about 100 nm and equal to or less than about 200 nm.

A cover film Cf serving as a cover layer, described in detail below, is provided on the uppermost layer (e.g. the first upper layer U1). The cover film Cf is a film including a third material (for example, chromium). In one or more embodiments the third material may be the same as the first material. A cover layer resist film Rcf (e.g. a patterned cover layer resist film) is provided on the cover film Cf and a first energy ray ER1 is radiated. The first energy ray ER1 is, for example, an electron ray. For example, electron beam drawing is performed. Alternatively, laser drawing may be performed. Thereafter, a portion of the cover layer resist film Rcf is removed. A resist pattern is formed from the cover layer resist film Rcf.

Figure 1B:
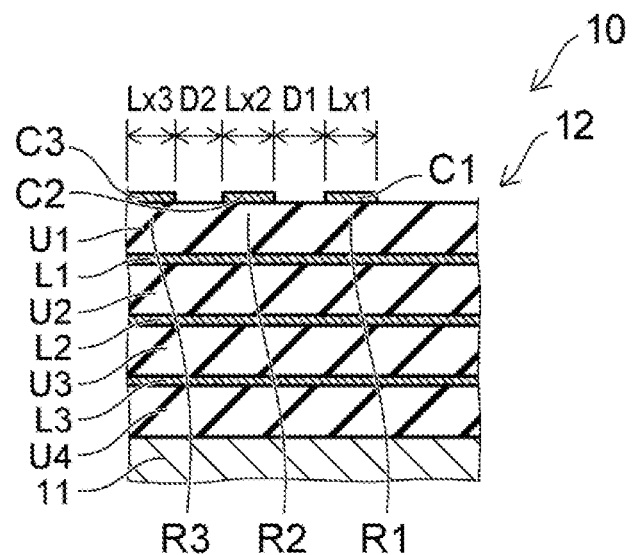

As illustrated in FIG. 1B, the cover film Cf is processed using the formed resist pattern as a mask. For example, when the cover film Cf contains chromium, dry etching can be performed using a chlorine-based gas and a gas mixture containing oxygen. Thus, the chromium-containing film is removed. The silicon oxide remains.

Thus, a plurality of cover layers (such as a first cover layer C1, a second cover layer C2, and a third cover layer C3) are formed. The cover layers are provided on the uppermost layer (e.g. the first upper layer U1). The plurality of cover layers contain the third material. The third material is different from the second material. The third material may be the same as the first material. For example, the third material includes chromium. The third material may include, for example, chromium oxide. The plurality of cover layers may be provided on the stacked body 12, or may constitute a portion of the stacked body 12.

The first cover layer C1 is provided on a first cover region R1 of the first upper layer U1. The second cover layer C2 is provided on a second cover region R2 of the first upper layer U1. The third cover layer C3 is provided on a third cover region R3 of the first upper layer U1. The second cover layer C2 is located between the first cover layer C1 and the third cover layer C3.

The plurality of cover layers may provide for high precision drawing. Therefore, location precision in the plurality of cover layers is high.

In this example, the widths of the plurality of cover layers are substantially the same. Intervals between the plurality of cover layers are substantially the same. For example, the plurality of cover layers with a substantially same width are provided at a substantially equal pitch.

For example, the width of each of the plurality of cover layers is a length in a first direction (e.g. a horizontal direction as shown in the example embodiments depicted in FIG. 1B) from the first cover layer C1 to the second cover layer C2. The width of the second cover layer C2 (a second length Lx2 of the second cover layer C2 in the first direction) is substantially the same as the width of the first cover layer C1 (a first length Lx1 of the first cover layer C1 in the first direction). For example, the second length Lx2 is 0.9 or more times and 1.1 or less times the first length Lx1. The width of the third cover layer C3 (a third length Lx3 of the third cover layer C3 in the first direction) is substantially the same as the first length Lx1. For example, the third length Lx3 is 0.9 or more times and 1.1 or less times the first length Lx1.

For example, a distance (a first distance D1) between the first cover layer C1 and the second cover layer C2 in the first direction is substantially the same as a distance (a second distance D2) between the second cover layer C2 and the third cover layer C3 in the first direction. For example, the first distance D1 is 0.9 or more times and 1.1 or less times the second distance D2.

Figure 1C:
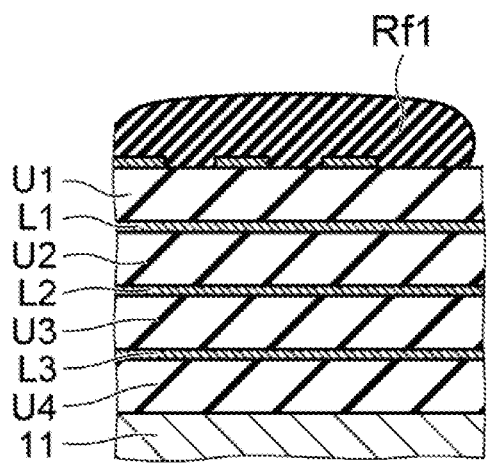

As illustrated in FIG. 1C, a first resist film Rf1 is formed on the plurality of cover layers. For example, a material serving as the first resist film Rf1 is applied. Thus, the first resist film Rf1 is formed.

Figure 1D:
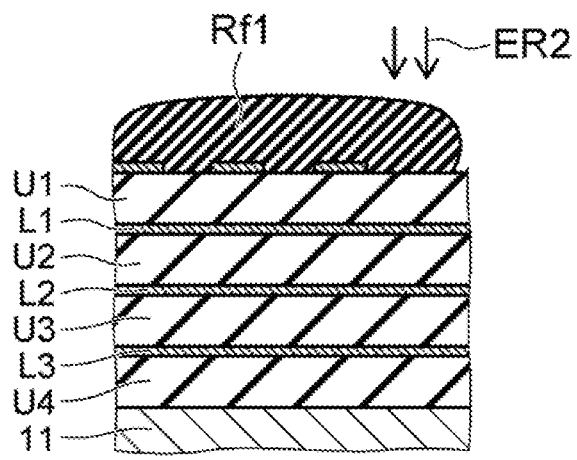

As illustrated in FIG. 1D, a second energy ray ER2 is radiated to the first resist film Rf1. The radiation of the second energy ray ER2 is, for example, laser radiation. In this example, the first resist film Rf1 is a positive resist film.

Figure 1E:
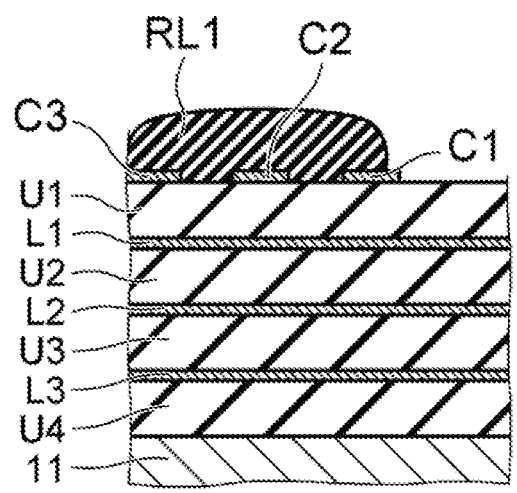

As illustrated in FIG. 1E, development is performed. A portion to which the second energy ray ER2 is radiated is removed. Thus, a first resist layer RL1 is formed. The first resist layer RL1 covers at least a portion of the first cover layer C1 and the cover layers C2 and C3.

In some implementations, a maximum acceptable error of the location of an end portion of the first resist layer RL1 corresponds to the width (the first length Lx1) of the first cover layer C1 (e.g. in some implementations the end portion should be located on the first cover layer C1). Therefore, precision (for example, location precision) may be low in the radiation of the second energy ray ER2, or a margin of a development region of the first resist film Rf1 can be in a broad range.

Figure 1F:
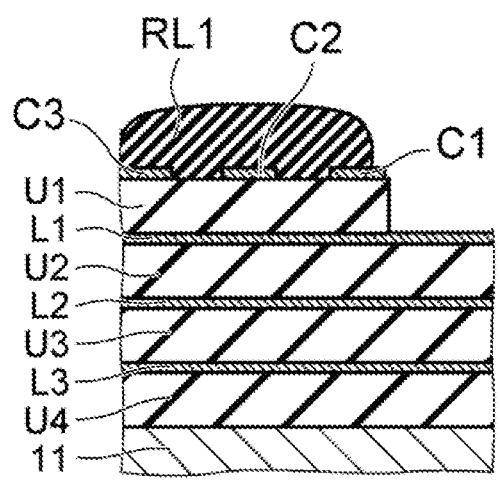

As illustrated in FIG. 1F, a portion of the first upper layer U1 is removed using the first cover layer C1 and the first resist layer RL1 as a mask. That is, the first upper layer U1 (for example, a silicon oxide) is etched. The first material is etched. For example, dry etching is performed using a gas such as tetrafluoromethane ($CF_4$). The silicon oxide film is removed. Chromium remains. Etching of the second material as described below can also be performed through a same or similar process.

Thus, a portion of the first lower layer L1 is exposed. In this etching, the first lower layer L1 functions as an etching stopper. Therefore, it is possible to forma step with a highly precise specified height corresponding to the thickness of the first upper layer U1.

In the manufacturing method, an end portion of the mask may correspond to and end portion of the first cover layer C1 (e.g. as the mask may include both the first resist layer RL1 and the first cover layer C1) in the etching process illustrated in FIG. 1F. As described above, in the forming of the plurality of cover layers (the first cover layer C1 and the like), the first energy ray ER1 is used. The location precision in the radiation of the first energy ray ER1 is high. On the other hand, the second energy ray ER2 is used to pattern the first resist layer RL1. As illustrated in FIG. 1E, at least a portion of the first cover layer C1 is exposed from an end of the first resist layer RL1. This can provide for the first cover layer C1 functioning as a mask, and therefore, the precision of the first resist layer RL1 may be low. The location precision of the second energy ray ER2 may be low.

In embodiments according to the first aspect, when the location precision of the first energy ray ER1 is high, the location precision of the second energy ray ER2 may be low. With this method, a high location precision can be obtained in the first upper layer U1 even when implementing a relatively less imprecise second energy ray ER2.

In this way, in the manufacturing method according to the first aspect, the structure 10 including the first substrate 11 and the stacked body 12 is prepared. The stacked body 12 is provided on the first substrate 11. The stacked body 12 includes the first lower layer L1 including the first material, the first upper layer U1 including the second material, and the first cover layer C1 including the third material. The second material is different from the first material. The third material is different from the second material. The first upper layer U1 is provided on the first lower layer L1. The first cover layer C1 is provided on a portion (the first cover region R1) of the first upper layer U1 (see FIG. 1B).

In the manufacturing method according to the first aspect, the first resist layer RL1 is formed on at least a portion of the first cover layer C1 and at least a portion of a region other than the first cover region R1 of the first upper layer U1 (see FIG. 1E).

In some embodiments of the manufacturing method according to the first aspect, a portion of the first upper layer U1 is removed using the first cover layer C1 and the first resist layer RL1 as a mask to expose a portion of the first lower layer L1 (see FIG. 10F).

Through the process, a step having a highly precise specified height can be formed. It is thus possible to provide the template manufacturing method capable of improved precision. As described above, the location precision may be low in the radiation of the second energy ray ER2. Therefore, simple, inexpensive, and/or efficient manufacturing equipment can be implemented. This, the step structure can be formed with a high throughput, and a template can be manufactured with high productivity.

In embodiments according to the first aspect, the following process may be further performed. As described above, in some embodiments, the stacked body 12 further includes the second lower layer L2 including the first material, the second upper layer U2 including the second material, and the second cover layer C2 including the third material. The second lower layer L2 is provided between the first lower layer L1 and the first substrate 11. The second upper layer U2 is provided between the second lower layer L2 and the first lower layer L1. The second cover layer C2 is provided on the second cover region R2 of the first upper layer U1 (see FIG. 1B).

Figure 2A:
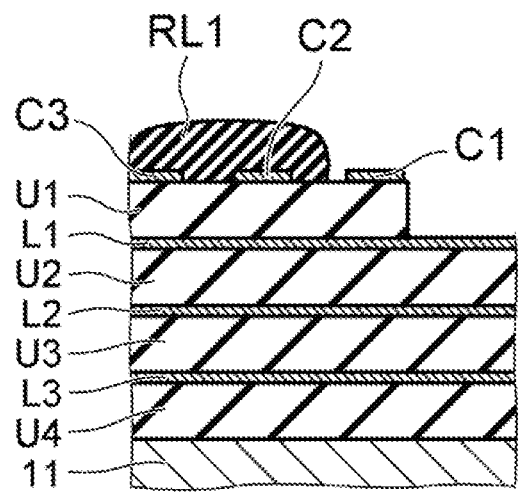
FIG. 2A, FIG. 2B, FIG. 2C, FIG. 2D, FIG. 2E, and FIG. 2F are schematic sectional views showing embodiments of a method of manufacturing the template according to the first aspect.

As described with reference to FIG. 1F, a portion of the first lower layer L1 is exposed. Thereafter, as illustrated in FIG. 2A, the first resist layer RL1 is processed to expose the first cover layer C1. For example, the first resist layer RL1 is subjected to slimming. For example, the slimming is performed through an oxygen asher process. In slimming described below, for example, an oxygen asher process is also performed.

Figure 2B:
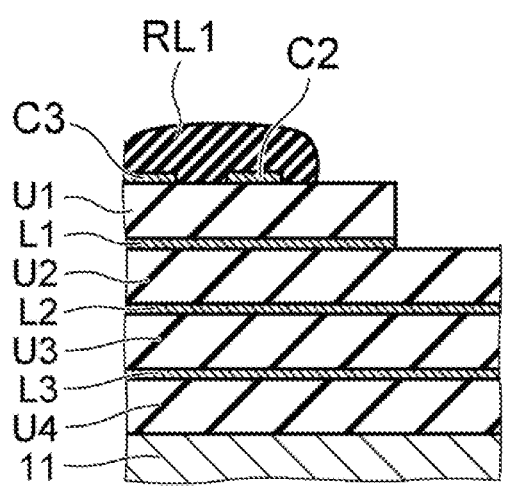

As illustrated in FIG. 2B, the exposed first cover layer C1 and the exposed portion of the first lower layer L1 are removed. For example, the first material and the third material (e.g. which may both include chromium) are etched. For example, dry etching is performed using a chlorine-based gas and a gas mixture containing oxygen. Etching of the first and third materials to be described below can also be performed through the same process.

Thus, another portion of the first upper layer U1 and a portion of the second upper layer U2 are exposed.

Figure 2C:
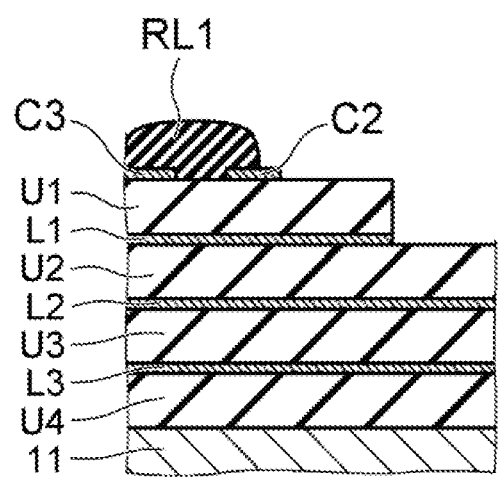

As illustrated in FIG. 2C, the first resist layer RL1 is processed. For example, the first resist layer RL1 is subjected to slimming. For example, an end portion of the first resist layer RL1 is retreated (e.g. away from the exposed portion of the first upper layer U1) through an oxygen asking process. Thus, a portion of the second cover layer C2 is exposed. For example, an end portion of the second cover layer C2 is exposed.

Figure 2D:
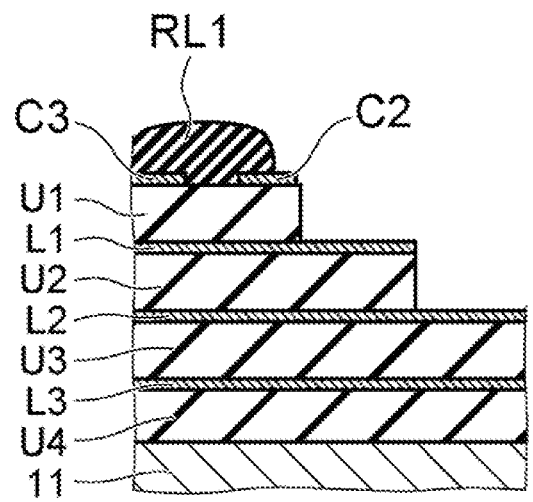

As illustrated in FIG. 2D, the exposed portion of the first upper layer U1 and the exposed portion of the second upper layer U2 are removed using the second cover layer C2 and the first resist layer RL1 as a mask. For example, the second material (for example, a silicon oxide) is etched. The lower layers (e.g. the first lower layer L1 and the second lower layer L2) including the first material may function as an etching stopper. Another portion of the first lower layer L1 and a portion of the second lower layer L2 are exposed through the etching.

Figure 2E:
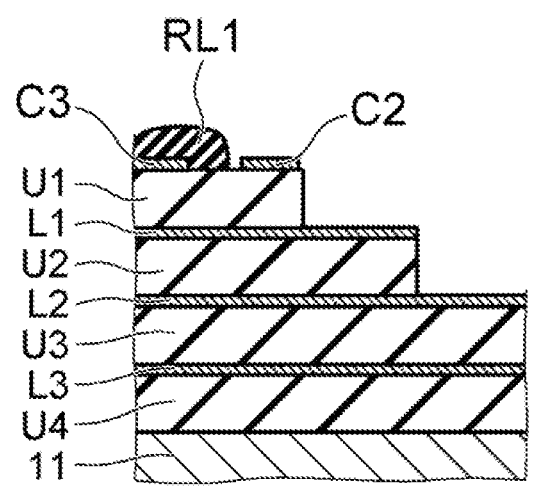
Figure 2F:
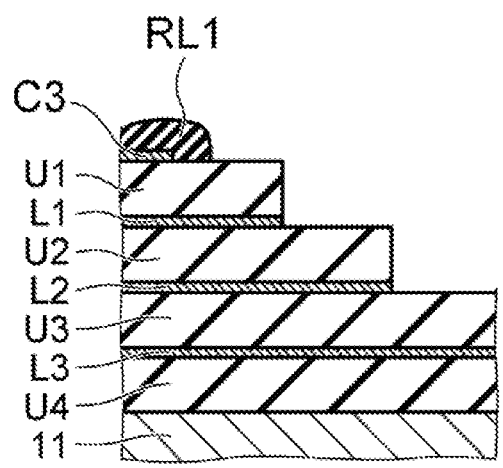

Through this process, a step structure that includes two steps can be formed, as shown in FIG. 2F.

In the two-step structure, the height of the steps are determined by the thickness of the plurality of upper layers and the plurality of lower layers. Therefore, it is possible to obtain one or more steps respectively having a highly precise specified height.

In the two-step structure, a precision of a width of the respective steps (the width of a top, exposed surface of the respective steps) is determined by a precision of the plurality of cover layers (e.g. the first cover layer C1 and the second cover layer C2). As described above, in the forming of the plurality of cover layers, the first energy ray ER1 is radiated with high precision. In some implementations, in the slimming of the first resist layer RL1 described with reference to FIG. 2A, an acceptable maximum error of the width of the steps corresponds to the width (the second length) of the second cover layer C2. Thus, for example, the precision of the slimming may be low. Therefore, simple, inexpensive, and/or efficient manufacturing equipment can be implemented. The step structure can be formed with a high throughput. A template can be manufactured with high productivity.

In this way, in some embodiments according to the first aspect, it is possible to form the step structure including the plurality of steps with high precision. Thus it is possible to readily improve precision.

A step structure with three or more steps can be obtained by repeating at least some of the foregoing processes.

For example, as described above, the stacked body 12 further includes the third lower layer L3 including the first material, the third upper layer U3 including the second material, and the third cover layer C3 including the third material. The third lower layer L3 is provided between the second lower layer L2 and the first substrate 11. The third upper layer U3 is provided between the third lower layer L3 and the second lower layer L2. The third cover layer C3 is provided on the third cover region R3 of the first upper layer U1 (see FIG. 1B).

As described above with reference to FIG. 2D, portion of the first lower layer L1 and portion of the second lower layer L2 are exposed. As illustrated in FIG. 2E, the first resist layer RL1 is processed to expose the second cover layer C2.

As illustrated in FIG. 2F, the exposed second cover layer C2, the exposed portion of the first lower layer L1, and the exposed portion of the second lower layer L2 are removed. For example, the first material (for example, chromium) is etched. Thus, a portion of the first upper layer U1, a portion of the second upper layer U2, and a portion of the third upper layer U3 are exposed. For example, the surface of the layer including the second material (for example, a silicon oxide) is exposed.

Figure 3A:
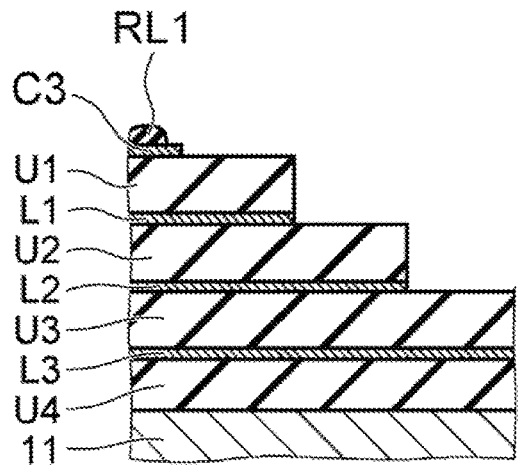
FIG. 3A, FIG. 3B and FIG. 3C are schematic sectional views showing embodiments of a method of manufacturing the template according to the first aspect.

As illustrated in FIG. 3A, the first resist layer RL1 is processed to expose a portion of the third cover layer C3. For example, the first resist layer RL1 is subjected to slimming. Thus, an end portion of the third cover layer C3 is exposed.

Figure 3B:
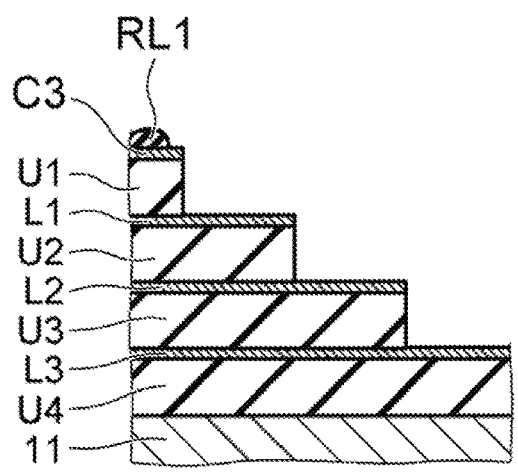

As illustrated in FIG. 3B, the exposed portion of the first upper layer U1, the exposed portion of the second upper layer U2, and the exposed portion of the third upper layer U3 are removed using the third cover layer C3 and the first resist layer RL1 as a mask. For example, the second material (for example, a silicon oxide) is etched. Thus, a portion of the first lower layer L1, a portion of the second lower layer L2, and a portion of the third lower layer L3 are exposed.

Figure 3C:
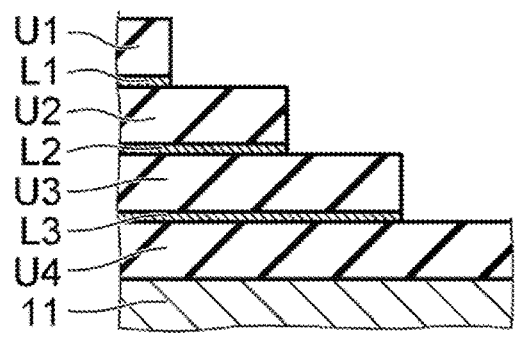

As illustrated in FIG. 3C, the first resist layer RL1 is removed. Further, the exposed portions of the plurality of lower layers (the first lower layer L1, the second lower layer L2, and the third lower layer L3) are removed. For example, the first material (for example, chromium) is removed.

In this way, the three-step structure is formed. A step structure with any number of steps can be obtained by repeating at least some of the processes described above.

In embodiments according to the first aspect, as described above, the radiations of the energy rays used for processing may be performed with different precisions. Thus, a template with high precision can be manufactured with high productivity.

For example, as described above, some embodiments of the template manufacturing method according to the first aspect includes forming the first cover layer C1. The forming of the first cover layer C1 includes radiating the first energy ray ER1 to the cover layer resist film Rcf provided on the cover film Cf to form the first cover layer C1. On the other hand, the forming of the first resist layer RL1 includes radiating the second energy ray ER2 to the first resist film Rf1 to form the first resist layer RL1. In some embodiments according to the first aspect, the location precision in the radiation of the first energy ray ER1 is higher than the location precision in the radiation of the second energy ray ER2. In other words, the location precision in the radiation of the second energy ray ER2 may be relatively low. Thus, it is possible to obtain high precision even when a simple manufacturing apparatus is used. It is possible to obtain a high throughput. Thus a template can be manufactured with high productivity.

Hereinafter, an example of a pattern forming method using the template according to the first aspect will be described. In the pattern forming method, imprinting is performed using the template.

FIG. 4A through FIG. 4F are schematic sectional views showing embodiments of a pattern forming method using the template according to the first aspect.

Figure 4A:
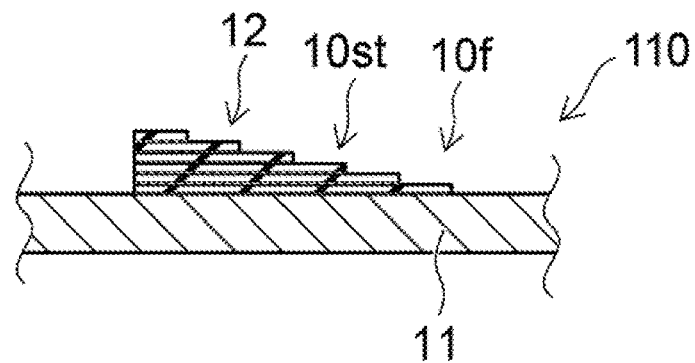
FIG. 4A, FIG. 4B, FIG. 4C, FIG. 4D, FIG. 4E, and FIG. 4F are schematic sectional views showing embodiments of a pattern forming method using the template according to the first aspect.

As illustrated in FIG. 4A, a first template 110 is prepared. The first template 110 includes the first substrate 11 and the stacked body 12. A step structure 10st of the first template 110 has a first surface 10f that defines one or more steps.

Figure 4B:
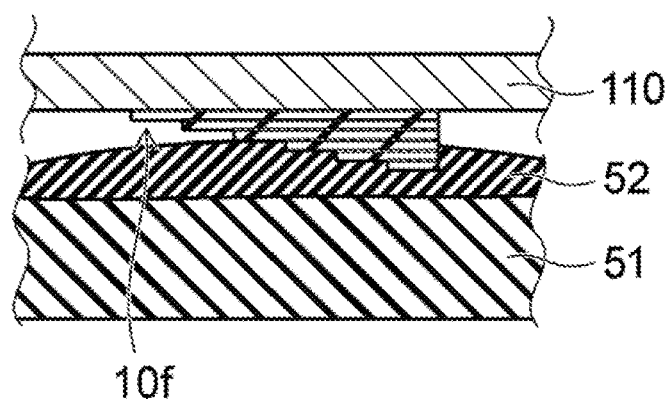

As illustrated in FIG. 4B, a resin liquid film 52 is provided on a processing substrate 51. The resin liquid film 52 comes into contact with the step structure 10st.

Figure 4C:
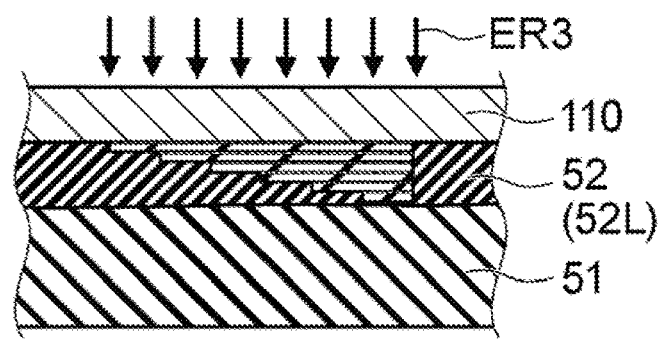

As illustrated in FIG. 4C, the resin liquid film 52 is substantially solidified. For example, when the resin liquid film 52 has a photosetting property, and light (a third energy ray ER3) is radiated. In this case, the layers provided in the first template 110 have transparency to the light. In other embodiments, the resin liquid film 52 has a thermosetting property, and a heating treatment is performed. Thus, a solidified resin layer 52L can be obtained from the resin liquid film 52.

Figure 4D:
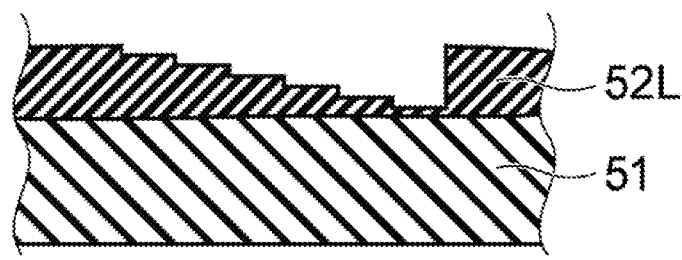

As illustrated in FIG. 4D, the first template 110 is detached from the resin layer 52L. The resin layer 52L has a stepped surface shape that complements the first template 110.

Figure 4E:
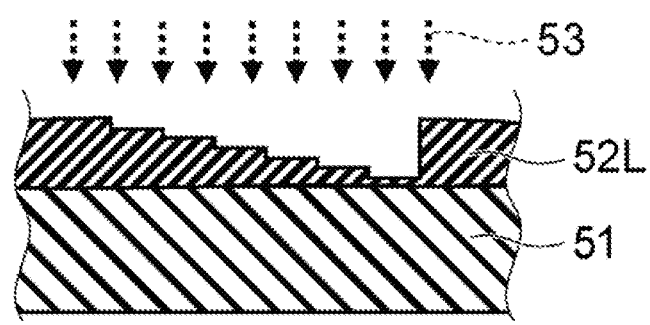

As illustrated in FIG. 4E, an etching process 53 is performed. For example, reactive ion etching (RIE) or the like is performed.

Figure 4F:
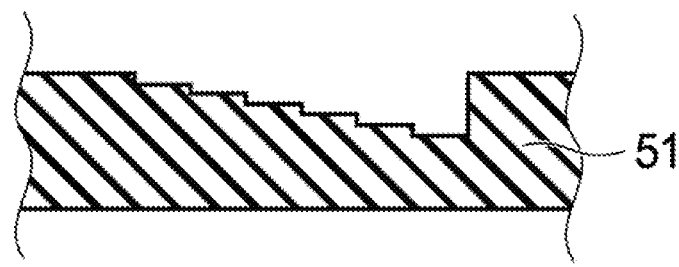

As illustrated in FIG. 4F, the processing substrate 51 is thus shaped to correspond to the shape of the resin layer 52L.

For example, the processing substrate 51 includes a plurality of first films and a plurality of second films that are alternately stacked. The first films contain, for example, a silicon nitride. The second films contain, for example, a silicon oxide. One or more steps are formed in the stacked first and second films by imprinting performed using the first template 110. In some embodiments, in a region of the processing substrate 51 that does not define any of the one or more steps, a memory unit (a 3-dimensional memory cell) is provided in the stacked films. For example, one of the first and second films is removed. The other of the first and second films remains. A conductive material (for example, tungsten) is introduced in a space created by the removal of the one of the first and second films. In this way, a plurality of stacked conductive layers can be formed. The plurality of conductive layers serve as, for example, wirings (for example, word lines) for a plurality of memory cells. The step portions serve as connection portions of the plurality of wirings. In this way, the template 110 according to the embodiment can be used to form the connection portions of the wirings of a 3-dimensional memory.

Figure 5A:
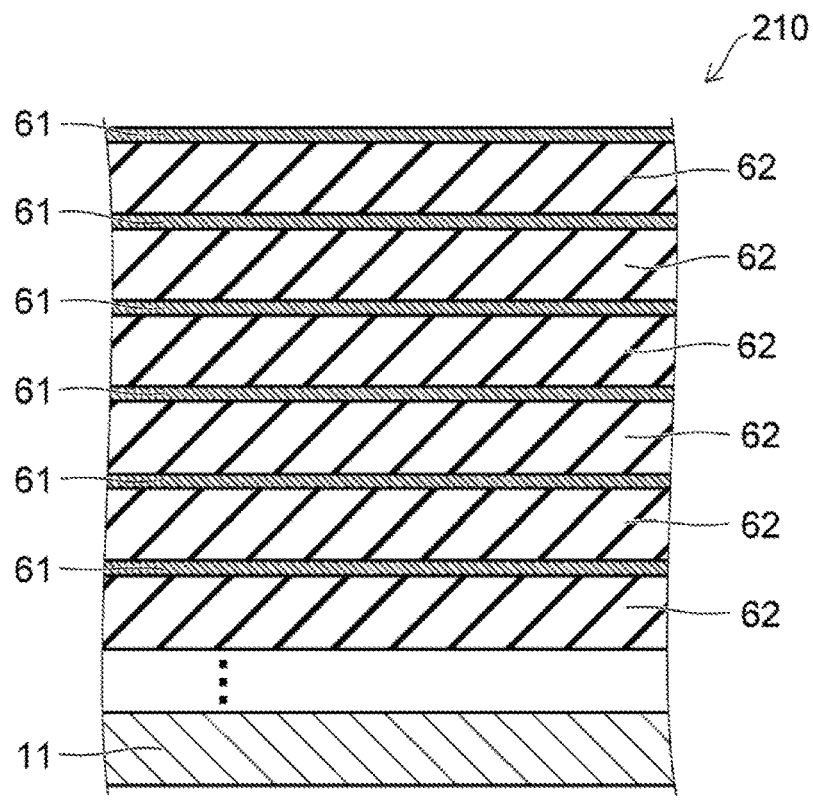
FIG. 5A and FIG. 5B are schematic sectional views showing embodiments of a template according to the first aspect.
Figure 5B:
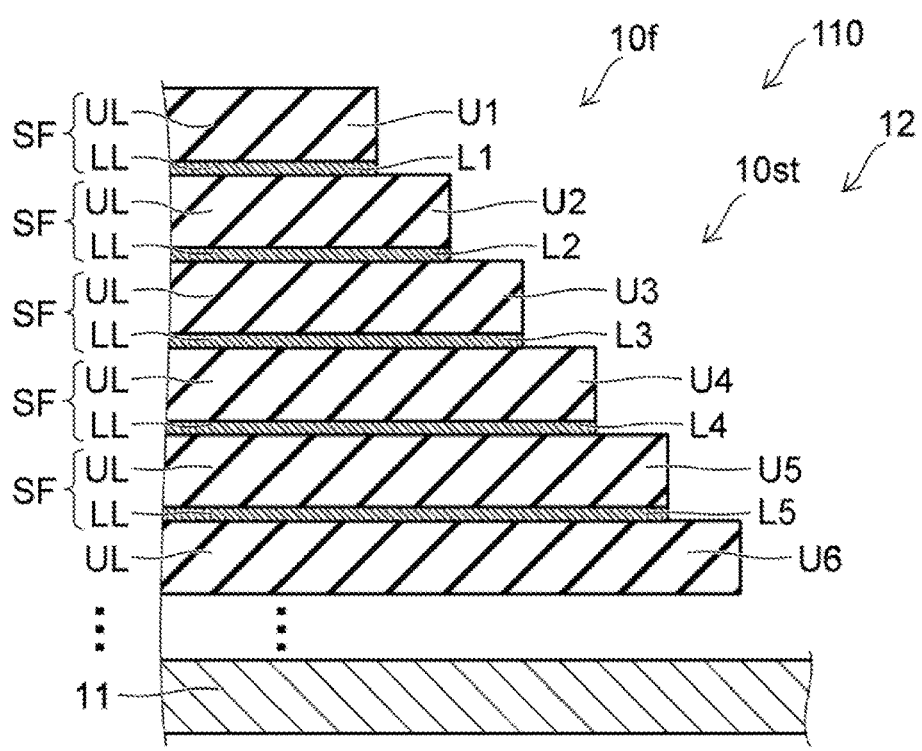

FIG. 5A and FIG. 5B are schematic sectional views showing embodiments of the template according to the first aspect.

FIG. 5B shows stepped portions of the first template 110. FIG. 5A shows a state before the stepped portions are formed. FIG. 5A illustrates a template base member 210 used to form the first template 110.

As illustrated in FIG. 5A, the template base member 210 includes a plurality of first layers 61 and a plurality of second layers 62 that are alternately stacked. The first layer 61 is a layer including the first material, described above. The second layer 62 is a layer including the second material, described above. The second material is different from the first material. The thickness of the first layer 61 is less than the thickness of the second layer 62. The first material includes, for example, chromium. The second material includes, for example, a silicon oxide (for example, quartz).

The plurality of first layers 61 correspond to, for example, the plurality of lower layers (such as the first to third lower layers L1 to L3) described above. The plurality of second layers 62 correspond to, for example, the plurality of upper layers (such as the first to fourth upper layers U1 to U4) described above.

One of the plurality of first layers 61 may correspond to the cover film Cf described above. Alternatively, layers including the third material (described above) may be provided on the uppermost layer (the uppermost second layer 62) and these layers may serve as the plurality of cover layers (the cover film Cf).

By using the template base member 210, it is possible to form a template in accordance with the above-described manufacturing method.

As illustrated in FIG. 5B, the first template 110 includes the stacked body 12. The stacked body 12 includes a plurality of stacked films SF. Each of the plurality of stacked films SF includes a lower layer LL including the first material and an upper layer UL including the second material different from the first material. One of the lower layers LL is, for example, the first lower layer L1. One of the upper layers UL is, for example, the first upper layer U1. In each stacked film SF, the upper layer UL is provided on the lower layer LL. The plurality of stacked films SF can define one or more steps of the first template 110.

In the plurality of stacked films SF, the respective thicknesses of the lower layers LL are substantially the same as each other. In the plurality of stacked films SF, the respective thicknesses of the upper layers UL are substantially the same as each other.

The first template 110 includes the step structure 10st that has a first surface 10f. For the step structure 10st, the respective heights of the steps of the step structure 10st defined by the plurality of stacked films SF are substantially the same as each other. For the step structure 10st, the widths of exposed top surfaces ("terrace" surfaces) of the steps defined by the plurality of stacked films SF are substantially the same as each other. The width of each terrace surface corresponds to, for example, a pitch of a plurality of cover layers used in manufacture of the first template 110.

Second Aspect

Embodiments according to the second aspect relate to a template manufacturing method that uses a template according to the first aspect. For example, the first template 110 serving as a reference is formed according to the first embodiment. The first template 110 is, for example, a master template. According to some embodiments of the second aspect, a second template is manufactured using the first template 110. For example, a pattern for a semiconductor device or the like may be formed using the second template.

FIG. 6A through 6F are schematic sectional views showing embodiments of a method of manufacturing a template according to the second aspect.

Figure 6A:
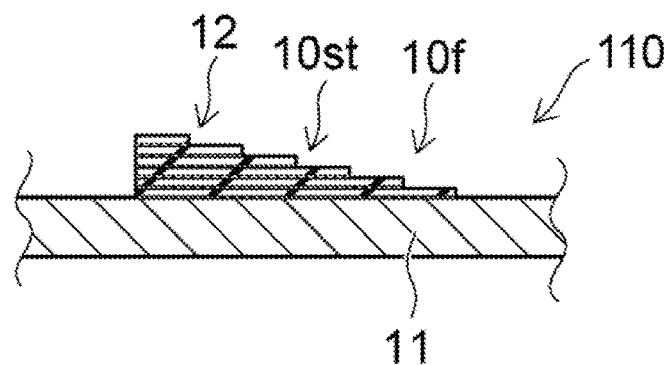
FIG. 6A, FIG. 6B, FIG. 6C, FIG. 6D, FIG. 6E, and FIG. 6F are schematic sectional views showing embodiments of a method of manufacturing a template according to a second aspect.

As illustrated in FIG. 6A, the first template 110 is prepared or provided. The first template 110 includes a plurality of stacked films SF (see FIG. 5B). Each of the plurality of stacked films SF includes a lower layer LL including a first material and an upper layer UL including a second material different from the first material. The first template 110 includes a first surface 10f. A step structure 10st of the first template 110 has a first surface 10f that defines one or more steps defined by the plurality of stacked films SF.

Figure 6B:
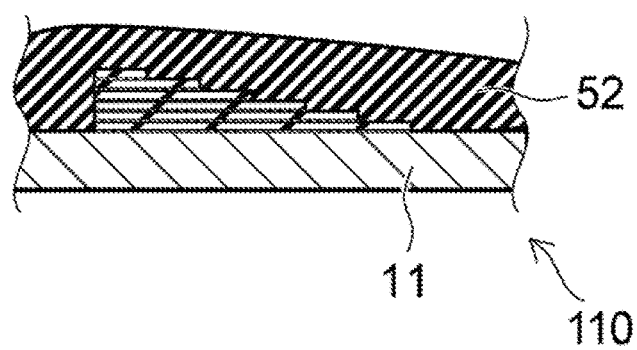

As illustrated in FIG. 6B, a resin liquid serving as a resin liquid film 52 is applied onto the first surface 10f of the step structure 10st. The resin liquid can serve as, for example, a resist.

Figure 6C:
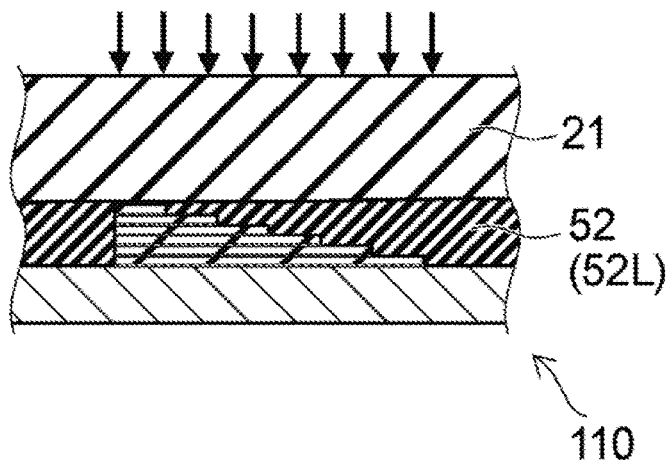

As illustrated in FIG. 6C, a second substrate 21 is placed on the resin liquid film 52. The second substrate 21 is, for example, a silicon oxide substrate (for example, a quartz substrate). The resin liquid film 52 is provided between the first surface 10f and the second substrate 21.

The resin liquid film 52 is substantially solidified to form a resin layer 52L in a state in which the resin liquid film 52 provided between the first surface 10f and the second substrate 21 comes into contact with the first surface 10f. For example, an ultraviolet ray is radiated to the resin liquid film 52. The ultraviolet ray may be transmitted through the second substrate 21 (quartz substrate).

Figure 6D:
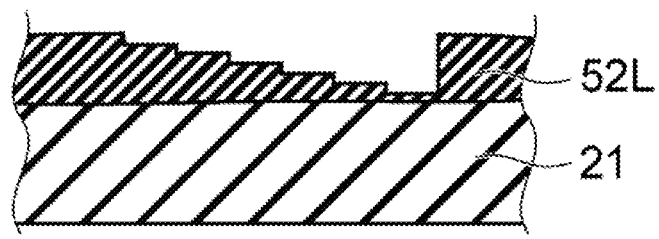

Thus, as illustrated in FIG. 6D, the resin liquid film 52 is solidified to obtain the resin layer 52L. The surface of the resin layer 52L has a shape corresponding to a shape of the first surface 10f of the step structure 10st.

Figure 6E:
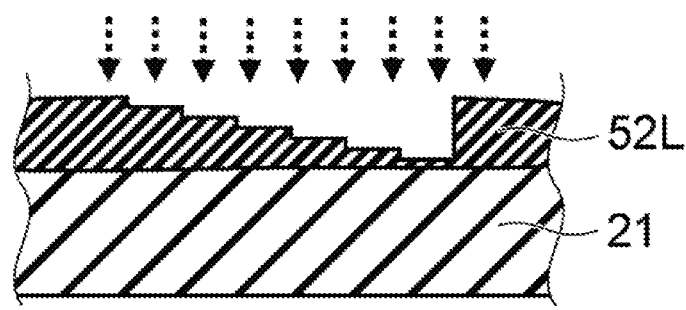

As illustrated in FIG. 6E, the second substrate 21 is processed using the resin layer 52L as a mask. For example, the silicon oxide material (for example, quartz) is etched.

Figure 6F:
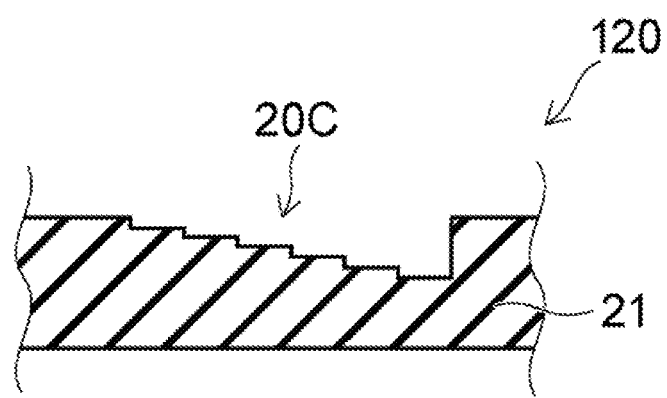

Thus, as illustrated in FIG. 6F, a shape corresponding to the first surface 10f of the step structure 10st is defined by the second substrate 21. Thus, a second template 120 can be obtained. The second substrate 21 has a second surface shape 20C to which a shape of the step structure 10st corresponds.

In some embodiments, a shape of the second surface shape 20C may be a reverse of the shape of the step structure 10st of the first template 110 (e.g. depressions of the step structure 10st may correspond to protrusions of the second surface shape 20C, and protrusions of the step structure 10st may correspond to depressions of the second surface shape 20C).

Further, a third template may be manufactured from the second template 120 in accordance with the same method. The third template may have a similar or same shape as the step structure 10st of the first template 110.

In this way, another template can be formed from the first template 110 of the master template.

In a 3-dimensional memory, steps may thus be provided in writing connection portions. The steps may be formed by, for example, nano-imprinting.

In some embodiments described herein, a plurality of pairs of stacked structures are provided on the substrate. The stacked structures contain a plurality of layers including different materials. A first material includes, for example, a metal or carbon. A second material is different from the first material. The second material is, for example, silicon oxide (for example, quartz). For example, a plurality of layers (cover layers) including a material different from the second material (which may be, for example, the same as or similar to the first material) are formed on the surface of the substrate. The plurality of layers have a predetermined width, and may be spaced from each other at a predetermined interval.

In some embodiments described herein, a first process and a second process may be performed. In the first process, a portion of a surface of the substrate is covered with a resist (a first resist layer RL1) that exposes a portion of the layer including the second material. Then, the layer of the second material is etched using the resist and the layer on the surface as a mask. In the second process, the layer including the first material is etched altering a region covered with the resist. The second step is repeated a plurality of times. Thus, a template that has a plurality of steps is prepared.

For example, the second process includes performing an etching process on the layer including the first material after performing an ashing process on the resist to contract the resist and changing a position of an end portion of the resist.

For example, the second process includes performing the ashing process on the resist to contract the resist. The second process may include forming an additional resist after removing the resist. The forming of the additional resist includes performing an exposure process and a development process on a material of which the additional resist is made. The exposure process includes, for example, at least one of laser radiation and electron ray radiation.

For example, the second process includes performing the asking process on the resist to contract the resist. The second process may include forming the additional resist after removing the resist. The forming of the additional resist may include, for example, performing ink jet application of a resist liquid and solidifying the resist liquid by radiation of light (for example, ultraviolet ray).

In some embodiments described herein, a step is formed by performing a cycle of slimming→chromium etching→slimming→silicon oxide etching once. Thereafter, this process is repeated. Finally, the chromium film is peeled off. Thus, it is possible to obtain the template with the step shape.

The number of repetitions can be repeated with a same resist. When the resist is thinned so that the resist is resistant to the chromium etching or the silicon oxide etching, the resist may be peeled off. Then, another resist may be formed and the process can resume from an alignment drawing stage. In a process of fabricating multiple steps, the process can be performed with pattern precision corresponding to that of a first drawing.

According to some embodiments described herein, for example, a template defining a step shape can be prepared at lower cost and with a higher throughput than in some comparative alignment drawing methods. First, drawing is performed with high precision. A precision of a width of a step to be formed corresponds to the first pattern forming precision. A precision of a height of the step corresponds to the precision of the thickness of the layer. Thus, strict etching precision is unnecessary. Thus, a step template can be readily formed with high quality.

In some embodiments described herein, a stage of manufacture including changing a coverage of the resist can be readily performed. For example, oxygen asking can be performed under time control. Thus, an end portion of the resist can readily be moved (e.g. contracted) to an intended position. A dry etching process can be performed as in some chromium etching or silicon oxide etching processes. For example, the step can be formed by repeating an etching process using oxygen, chlorine, or fluorine.

In some embodiments described herein, recovery to a start of a series of sequences can be performed after the resist is consumed and is resistant to etching.

According to some embodiments described herein, it is possible to provide the template manufacturing method and the template base member capable of improved precision.

In the present specification, "vertical" and "parallel" are not strictly vertical and strictly parallel, but also include, for example, variations or the like in the manufacturing steps, and may be substantially vertical and substantially parallel.

The embodiments of the disclosure have been described above with respect to specific examples. However, the embodiments of the disclosure are not limited to the specific examples. For example, specific configurations of elements such as the lower layers, the upper layers, and the cover layers provided in the template can be appropriately selected by those skilled in the art to implement embodiments of the disclosure, and are included in the scope of the disclosure as long as at least some of the advantages of the embodiments described herein are provided for.

Components described herein may be combined as appropriate, provided such combination does not deviate from the merits of the present disclosure.

In addition, all the template manufacturing methods and template base members can be appropriately modified in design by those skilled in the art, provided such modification does not deviate from the merits of the present disclosure.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

In addition, various modifications and corrections can be made by those skilled in the art, and such modifications and corrections are within the scope of the present disclosure.

While certain embodiments have been described herein, these embodiments have been presented by way of example only, and are not intended to limit the scope of the present disclosure. Indeed, the embodiments described herein may be embodied or combined in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A template manufacturing method comprising:
providing a first template, on a first substrate, that comprises a plurality of stacked films, each of the plurality of stacked films comprising a lower layer comprising a first material and an upper layer comprising a second material different from the first material, a first surface of the first template comprising a step structure in which one or more steps are defined by the plurality of stacked films;
patterning a resin layer to form a mask, wherein the patterning the resin layer comprises disposing a resin liquid film between the first template and a second substrate;
solidifying the resin liquid film while the first surface of the first template is in contact with the resin liquid film to pattern the resin layer defining a resin layer surface shape that corresponds to a shape of the step structure, wherein the solidifying the resin liquid film comprises radiating an ultraviolet ray to the resin liquid film through the second substrate; and forming a second template, using the mask arranged on a surface of the second substrate.

2. The template manufacturing method according to claim 1, wherein the first material comprises a metal comprising chromium.

3. The template manufacturing method according to claim 2, wherein the first material comprises a chromium oxide.

4. The template manufacturing method according to claim 3, wherein the second material comprises a silicon oxide or quartz.

5. The template manufacturing method according to claim 1, wherein the first material comprises carbon.

* * * * *